United States Patent
Abe et al.

(10) Patent No.: US 10,353,594 B2
(45) Date of Patent: Jul. 16, 2019

(54) ELECTRONIC CONTROL UNIT FOR VEHICLE AND METHOD OF WRITING DATA

(75) Inventors: Yusuke Abe, Isesaki (JP); Koji Yuasa, Isesaki (JP); Toshihisa Arai, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 879 days.

(21) Appl. No.: 13/616,012

(22) Filed: Sep. 14, 2012

(65) Prior Publication Data

US 2013/0073799 A1    Mar. 21, 2013

(30) Foreign Application Priority Data

Sep. 21, 2011   (JP) .................. 2011-205440

(51) Int. Cl.
*G06F 12/02* (2006.01)
*G06F 3/06* (2006.01)
(Continued)

(52) U.S. Cl.
CPC ......... *G06F 3/0613* (2013.01); *F02D 41/249* (2013.01); *G06F 3/068* (2013.01); *G06F 3/0656* (2013.01); *G06F 3/0679* (2013.01); *G06F 3/0688* (2013.01); *G06F 12/0246* (2013.01); *G11C 7/10* (2013.01); *G06F 2212/1016* (2013.01); *G06F 2212/173* (2013.01); *G06F 2212/7203* (2013.01)

(58) Field of Classification Search
CPC .... G06F 12/0246; G06F 1/3275; G06F 3/061; G06F 3/0656; G06F 3/0683; G06F 5/065; G06F 11/10; G06F 2212/7203; G06F 8/65; G06F 13/1684; G06F 13/38; G06F 13/385; G06F 13/387; G06F 13/42; G11C 7/22; G11C 7/222
See application file for complete search history.

(56) References Cited

U.S. PATENT DOCUMENTS 5,889,933 A * 3/1999 Smith ............................ 714/22
6,421,274 B1 * 7/2002 Yoshimura ............... 365/185.12
(Continued)

FOREIGN PATENT DOCUMENTS

JP   63-223901 A   9/1988
JP   10-111863    4/1998
(Continued)

OTHER PUBLICATIONS

Computer Architecture; A Quantitative Approach by Hennessy and Patterson; Third Edition; 2003; pp. 694-697.*
(Continued)

*Primary Examiner* — Reginald G Bragdon
*Assistant Examiner* — Paul M Knight
(74) *Attorney, Agent, or Firm* — Crowell & Moring LLP

(57) ABSTRACT

An electronic control unit for a vehicle including a nonvolatile memory capable of erasing and writing data electrically and two buffers to acquire, by communication, divided data obtained by dividing a program by predetermined size. Then, in parallel with using the two buffers alternately to receive divided data, the electronic control unit for a vehicle uses one buffer that is not used to receive divided data to write the received divided data into the nonvolatile memory.

14 Claims, 17 Drawing Sheets

(51) Int. Cl.
*F02D 41/24* (2006.01)
*G11C 7/10* (2006.01)

(56) References Cited

U.S. PATENT DOCUMENTS

| | | | |
|---|---|---|---|
| 6,948,113 B1 * | 9/2005 | Shaver | 714/769 |
| 2001/0032288 A1 | 10/2001 | Matsuura et al. | |
| 2003/0069671 A1 | 4/2003 | Yashiki et al. | |
| 2005/0125625 A1 * | 6/2005 | Kilian | G06F 3/0611 711/202 |
| 2005/0188105 A1 * | 8/2005 | Reinhard | H04L 12/4633 709/238 |
| 2005/0270888 A1 | 12/2005 | Watanabe et al. | |
| 2006/0085346 A1 * | 4/2006 | Riley | H04L 41/12 705/51 |
| 2007/0113052 A1 * | 5/2007 | Lu | G06F 9/30156 712/210 |
| 2007/0139227 A1 * | 6/2007 | Speirs, II | H03M 7/30 341/50 |
| 2007/0214309 A1 | 9/2007 | Matsuura et al. | |
| 2007/0226401 A1 * | 9/2007 | Huang et al. | 711/103 |
| 2008/0204484 A1 * | 8/2008 | Kumagai | G06K 15/10 347/5 |
| 2009/0106399 A1 * | 4/2009 | Shibahara et al. | 709/219 |
| 2009/0327826 A1 | 12/2009 | Inoue et al. | |
| 2010/0005257 A1 * | 1/2010 | Tamura et al. | 711/156 |
| 2010/0199025 A1 * | 8/2010 | Nanjou et al. | 711/103 |
| 2011/0234263 A1 | 9/2011 | Shima et al. | |

FOREIGN PATENT DOCUMENTS

| | | |
|---|---|---|
| JP | 2001-297009 A | 10/2001 |
| JP | 2002-288034 A | 10/2002 |
| JP | 2003-122622 A | 4/2003 |
| JP | 2005-332148 A | 12/2005 |
| JP | 2006-340322 A | 12/2006 |
| JP | 2007-74170 A | 3/2007 |
| JP | 2007-241576 A | 9/2007 |
| JP | 2008-146521 A | 6/2008 |
| JP | 2009-207099 A | 9/2009 |
| JP | 2010-11296 A | 1/2010 |
| JP | 2011-118922 A | 6/2011 |
| JP | 2011-160181 A | 8/2011 |
| JP | 2011-205440 A | 10/2011 |

OTHER PUBLICATIONS

Japanese Office Action dated Aug. 13, 2013 with partial English translation (three (3) pages).
U.S. Appl. No. 13/615,794, filed Sep. 14, 2012.
Japanese Patent Office Communication dated Apr. 15, 2014 in Appln. No. 2011-205440 with partial English language translation thereof (three (3) pages).
Japanese Office Action dated Aug. 28, 2014, with partial English translation (Two (2) pages).
Japanese Appeal Decision dated May 12, 2015, with Partial English translation (Thirty-one (31) pages).
Japanese Office Action dated Jun. 2, 2015, with Partial English translation (Six (6) pages).

\* cited by examiner

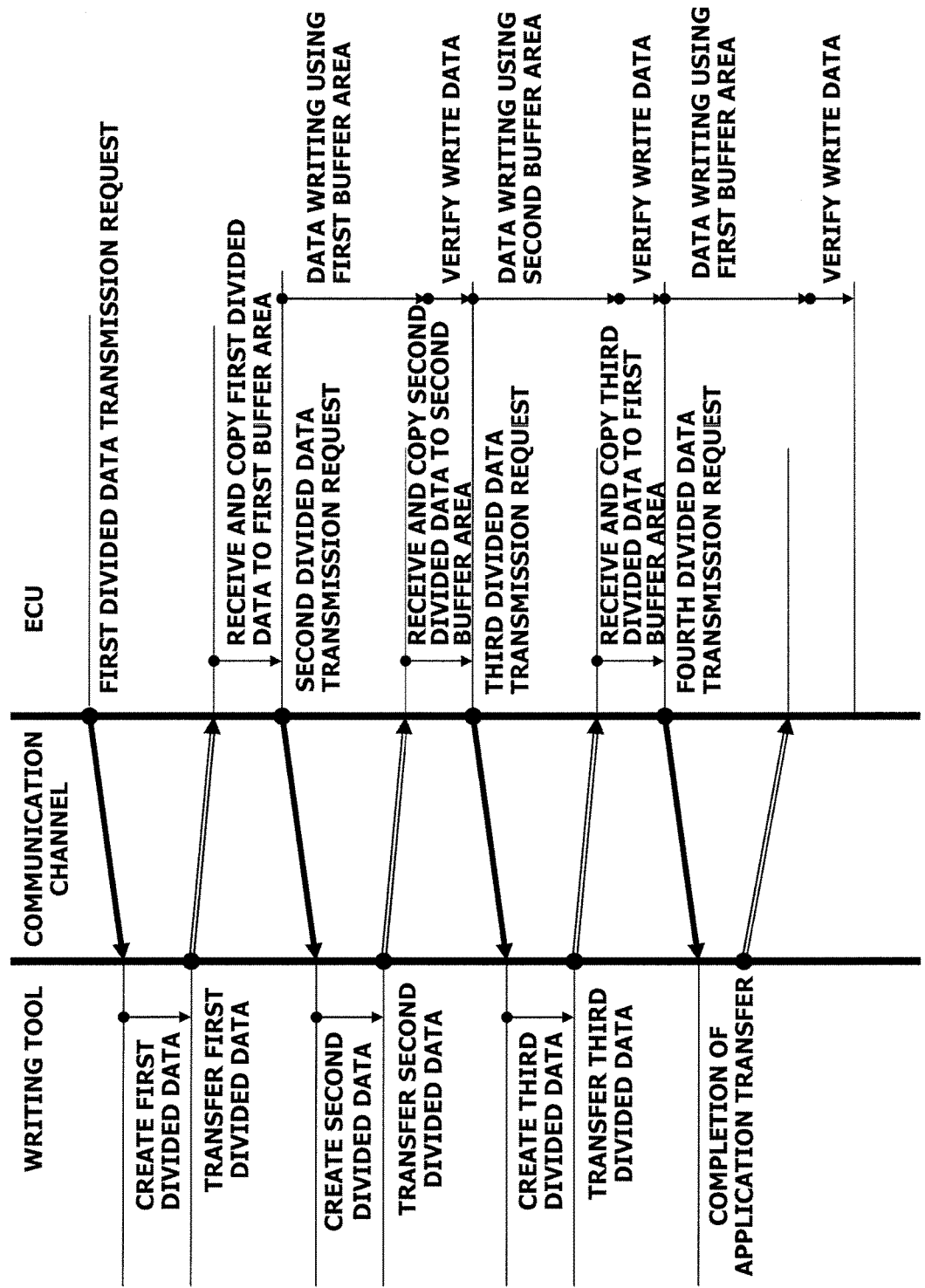

US 10,353,594 B2

ELECTRONIC CONTROL UNIT FOR VEHICLE AND METHOD OF WRITING DATA

BACKGROUND OF THE INVENTION

1. Field of the Invention

The present invention relates to an electronic control unit for a vehicle and method of writing data.

2. Description of Related Art

An electronic control unit (ECU) for a vehicle is equipped with a nonvolatile memory (e.g., flash ROM (Read-Only Memory)) in which data can be written and erased electronically. The electronic control unit controls on-vehicle devices (e.g., fuel injector) by a control program or the like stored in the nonvolatile memory.

As described in Japanese Laid-Open Patent Publication No. 2008-146521, in a case in which data of a control program or the like is written into a nonvolatile memory, a writing tool for transferring write data to an electronic control unit is connected to the electronic control unit. Then, the electronic control unit writes the write data into the nonvolatile memory while transferring the write data from the writing tool.

In the meantime, the writing tool divides the overall write data by predetermined size, and transfers divided write data (divided data) sequentially to the electronic control unit. In this case, after writing transferred divided data into the nonvolatile memory, the electronic control unit performs receive processing for the next divided data. Thus, the electronic control unit alternately performs divided data writing processing and divided data receiving processing to write the overall write data into the nonvolatile memory. Therefore, the time required to write the overall write data into the nonvolatile memory is the sum of the time required for writing processing for all pieces of divided data and the time required for receiving processing for all pieces of divided data.

SUMMARY OF THE INVENTION

An electronic control unit for a vehicle includes a nonvolatile memory capable of erasing and writing data electrically and two buffers, the electronic control unit receives, by communication, divided data obtained by dividing a program by predetermined size. Then, in parallel with receiving the divided data by using the two buffers alternately, the electronic control unit for a vehicle writes the divided data by using one buffer that is not used to receive the divided data, into the nonvolatile memory.

Other objects and features of aspects of the present invention will be understood from the following description with reference to the accompanying drawings.

BRIEF DESCRIPTION OF DRAWINGS

FIG. 17 is a sequence chart of an embodiment of application program transfer and writing processing.

DETAILED DESCRIPTION OF THE INVENTION

A preferred embodiment for carrying out the present invention will now be described in detail with reference to the accompanying drawings.

Figure 1:
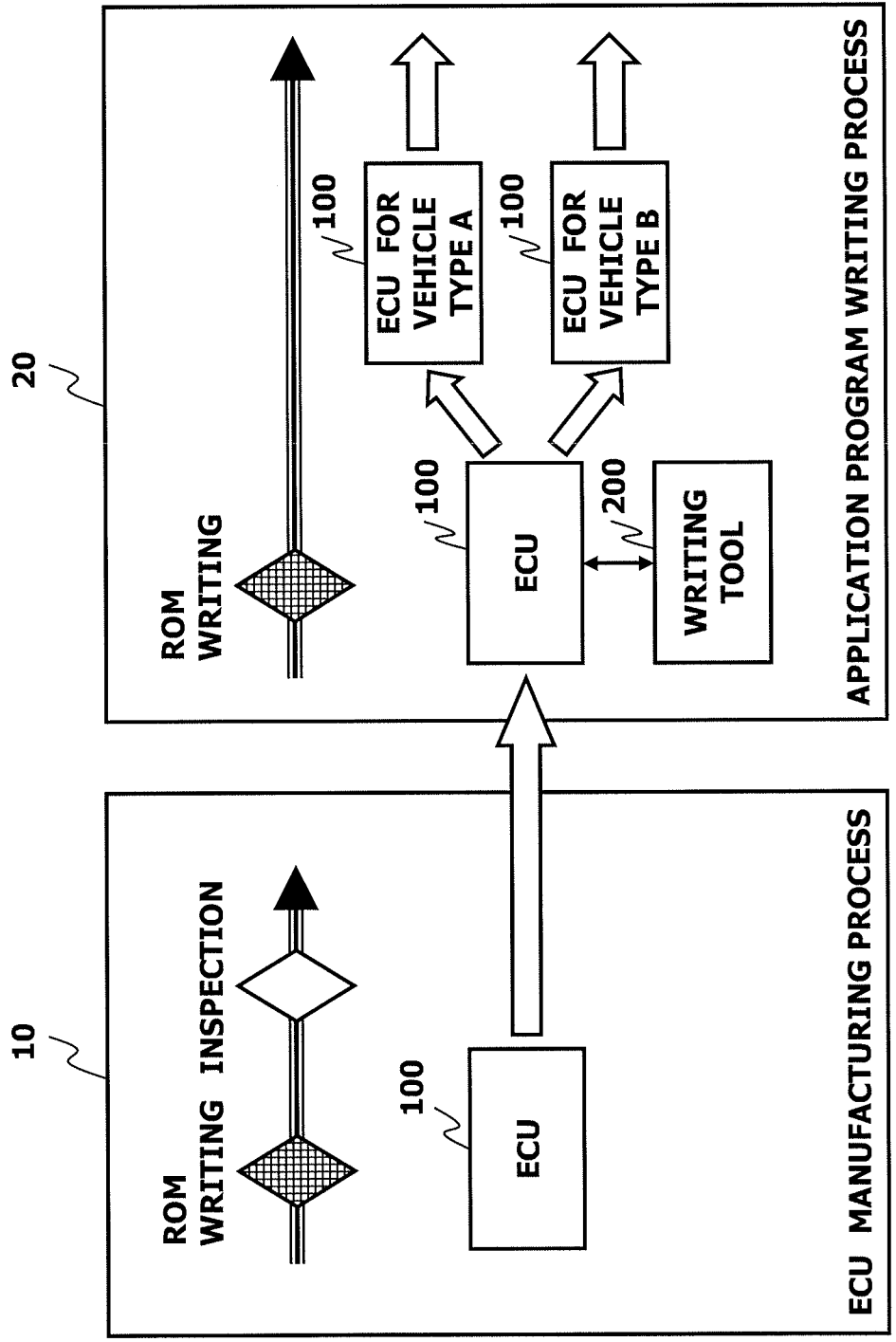
FIG. 1 is an explanatory view of an ECU manufacturing process and an application program writing process.

FIG. 1 illustrates an ECU manufacturing process 10 and an application program writing process 20 for writing an application program (e.g., engine control program) into a ROM (e.g., flash ROM) incorporated in an ECU 100.

In ECU manufacturing process 10, an operator writes a minimum program capable of running a hardware checking program and writing an application program in a later process to the ROM incorporated in ECU 100 to conduct an inspection. ECU manufacturing process 10 is, for example, part of a working process of an ECU supplier or the like.

In application program writing process 20, the operator uses a writing tool 200 to write an application program according to the type of vehicle into the ROM on ECU 100. Thus, ECU 100 supplied from ECU manufacturing process 10 is ECU 100 for each type of vehicle. In the later inspection process, the operator checks whether an application program according to a vehicle is written into the ROM of ECU 100 assembled in the vehicle. Furthermore, application program writing process 20 is, for example, part of a working process performed in association with an ECU assembly process at an automobile factory or the like.

Thus, since ECU 100 is common among all types of vehicles before writing an application program into the ROM in application program writing process 20, the ECU supplier or the like may, for example, manufacture ECUs common to all types of vehicles and deliver the ECUs to the automobile factory or the like. This eliminates the need for the ECU supplier or the like to do programming, manufacturing, delivery management, and the like of ECU 100 for each type of vehicle. This also eliminates the need to maintain and manage (stock status and the like of) ECU 100 for each type of vehicle before writing into ROM in application program writing process 20 at the automobile factory or the like. Thus, these processes have the advantages of enabling large reductions in manufacturing and management at the ECU supplier and the automobile factory or the like.

Figure 2:
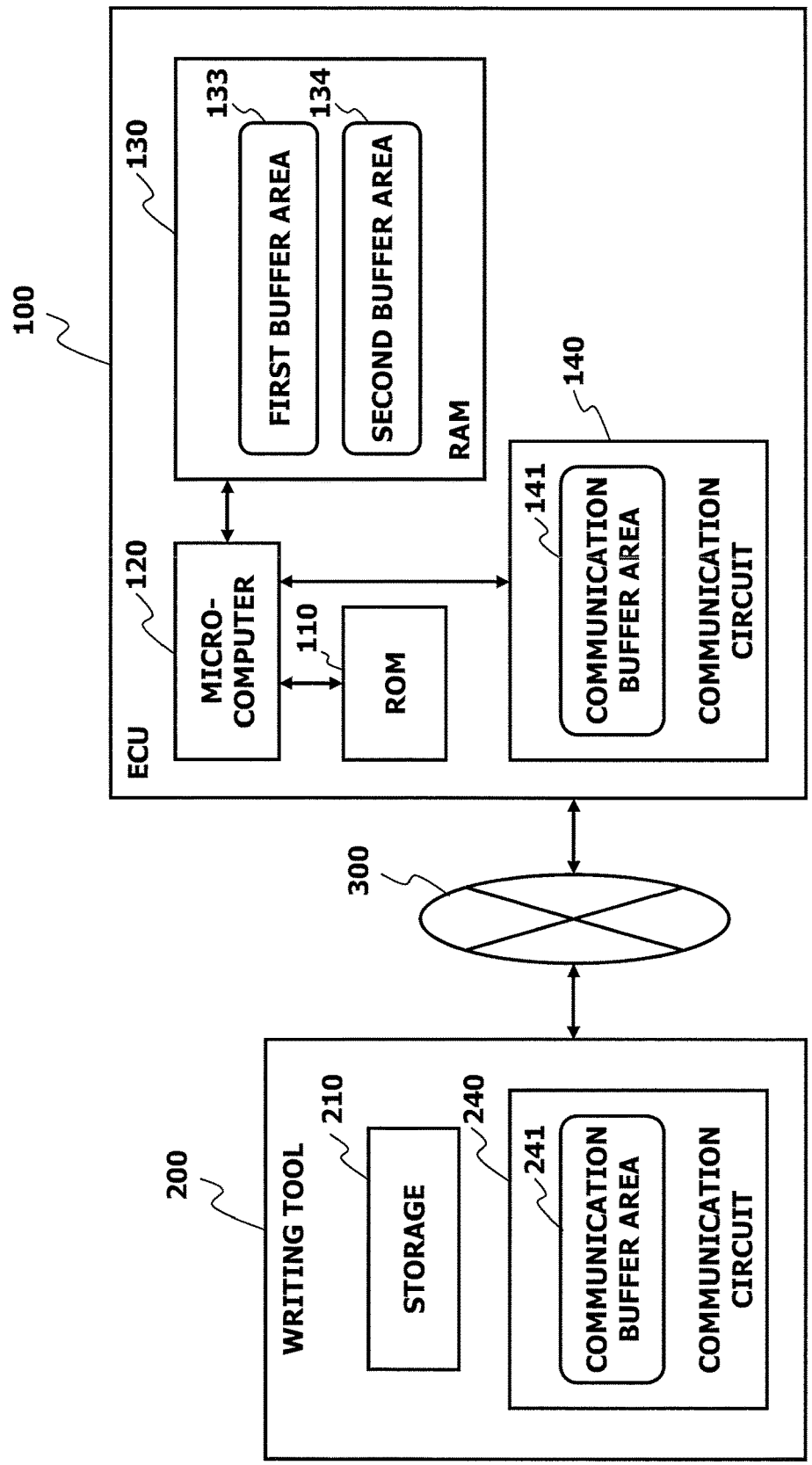
FIG. 2 is a configuration view of an ECU and a writing tool.

However, application program writing process 20 that did not exist in the conventional is newly added at the automobile factory or the like. In this application program writing process 20, it is required to write a vehicle type-specific application program into the ROM promptly. FIG. 2 illustrates a configuration of ECU 100 and writing tool 200 to meet this requirement.

ECU 100 controls fuel injection, ignition, and the like in an engine for a vehicle, and is configured to include a ROM 110, a microcomputer 120 (processor), a RAM (Random Access Memory) 130 as a volatile memory, and a communication circuit 140. ECU 100 is connected so as to be removable to writing tool 200 through a communication line 300 such as a CAN (Controller Area Network).

Microcomputer 120 includes a CPU, a cache memory, and the like to run various programs stored in ROM 110 and RAM 130.

In RAM 130, a first buffer area 133 and a second buffer area 134 are preallocated. First buffer area 133 and second buffer area 134 are used upon writing data into ROM 110.

In communication circuit 140, a communication buffer area 141 is preallocated. Communication buffer area 141 is used when ECU 100 communicates with another unit through communication circuit 140.

Writing tool 200 is configured to include a storage 210 (e.g., hard disk) and a communication circuit 240. Writing tool 200 also includes a terminal (e.g., personal computer) and a unit for connecting to ECU 100 so that the operator is able to interactively instruct writing tool 200. Writing tool 200 transfers write data stored in storage 210 to ECU 100.

An application program and the like to be transferred to ECU 100 is stored in storage 210.

In communication circuit 240, a communication buffer area 241 is preallocated. Communication buffer area 241 is used when writing tool 200 communicates with ECU 100 through communication circuit 240.

Figure 3:
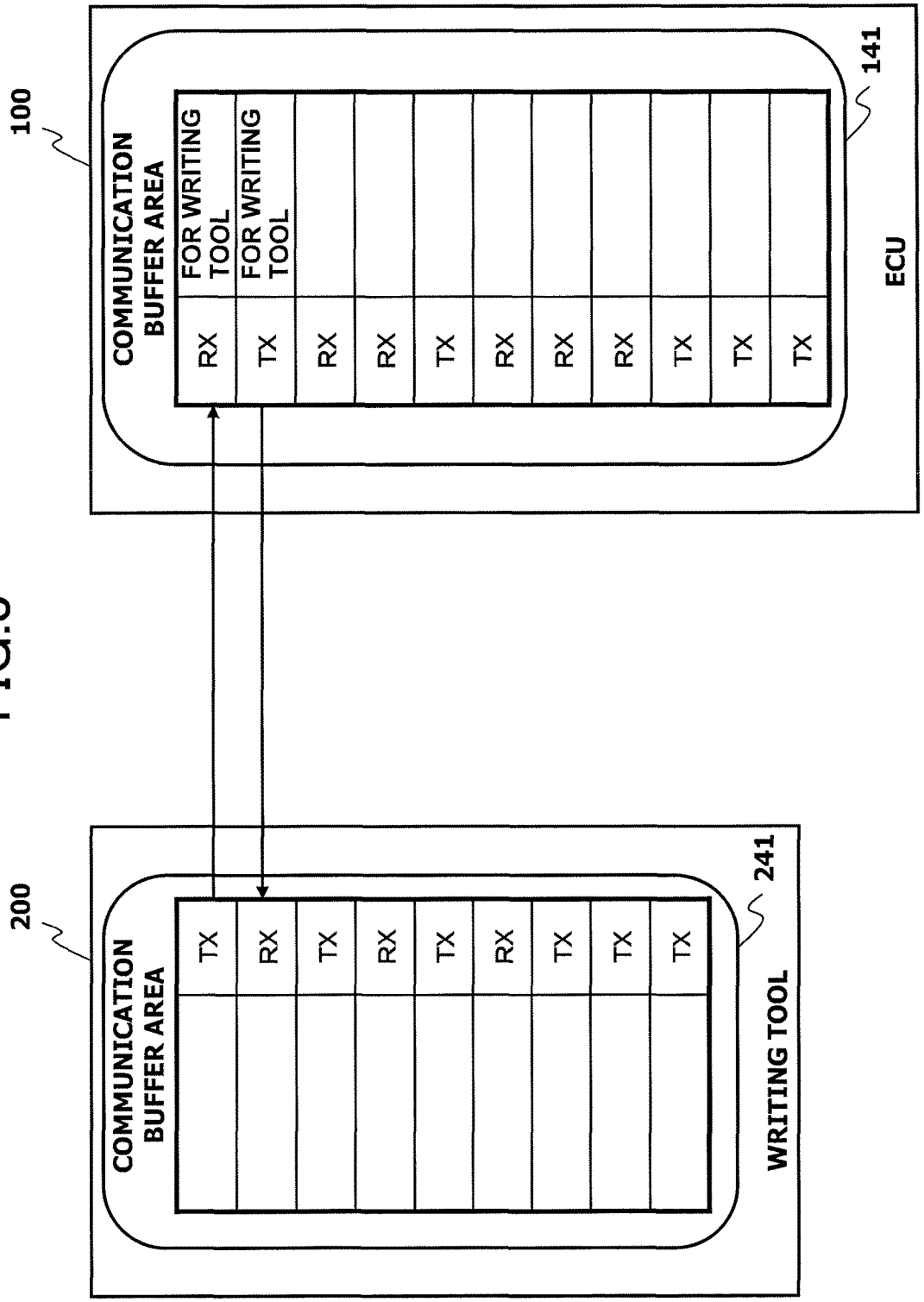
FIG. 3 is a detailed view of communication buffer areas.

Here, the details of communication buffer area 141 used when ECU 100 communicates with writing tool 200 will be illustrated in FIG. 3.

In communication buffer area 141 of ECU 100, there are two or more given-size communication buffers (e.g., mail boxes in CAN). When communicating with each unit, ECU 100 uses a communication buffer preassigned for communication with a communication target unit among the communication buffers in communication buffer area 141. Note that each communication buffer is divided into a transmit buffer (TX) used to send data and a receive buffer (RX) used to receive data. Here, the number of communication buffers preassigned for communication with a communication target unit is set to the number of buffers used in an in-vehicle communication environment.

On the other hand, there are two or more given-size communication buffers in communication buffer area 241 of writing tool 200. The size of each communication buffer in communication buffer area 241 is the same as the size of each communication buffer in communication buffer area 141 of ECU 100.

In FIG. 3, two communication buffers (one TX1 and one RX1) are assigned to communication buffer area 141 of ECU 100 as communication buffers (communication buffers for writing tool) used by ECU 100 to communicate with writing tool 200. The other communication buffers in communication buffer area 141 are assigned for communication with units other than writing tool 200.

Therefore, in a case in which the size of the communication buffer is eight bytes and ECU 100 communicates with writing tool 200 in synchronization with each other to return a response each time it receives one piece of data to writing tool 200, since one RX is used for receiving one piece of data, ECU 100 needs to perform communication 16 times in order to receive 64 bytes of data. In other words, since writing tool 200 transfers 64 bytes of data by dividing it into eight bytes of data and ECU 100 returns a response to writing tool 200 each time it receives eight bytes, the number of communications is 16.

Figure 4:
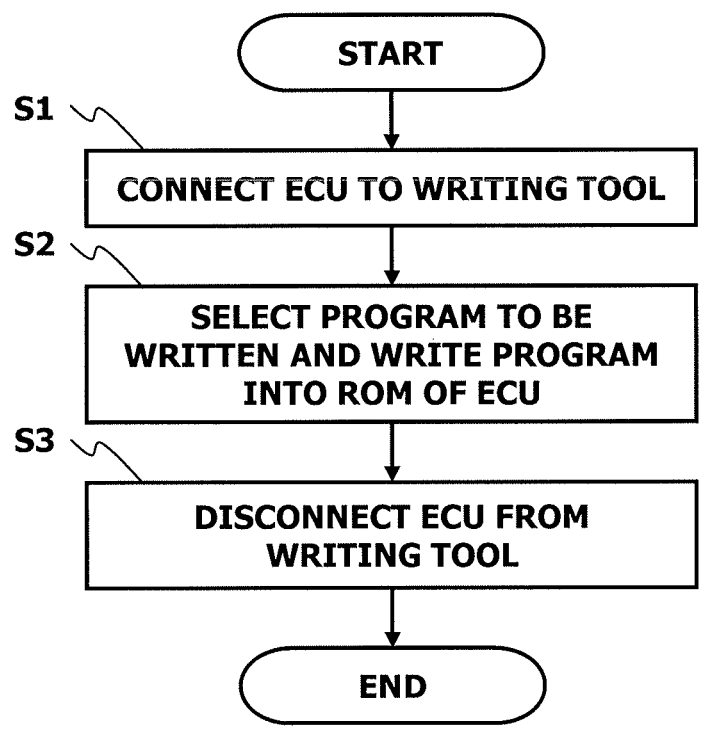
FIG. 4 is a flowchart of a procedure for the application program writing process.

FIG. 4 illustrates a procedure in application program writing process 20.

In step 1 (abbreviated as "S1" in the drawing; the same applies hereinafter), the operator connects ECU 100 to writing tool 200. Once connected, ECU 100 is powered on and microcomputer 120 executes the minimum program to make ECU 100 communicable with writing tool 200, waiting for receiving data to be transferred from writing tool 200.

In step 2, the operator specifies an application program (e.g., an engine control program for vehicle type A) and the like to be written into ROM 110. When an application program is specified, writing tool 200 transfers the specified application program to ECU 100. ECU 100 writes the application program into ROM 110 while receiving the transferred application program and the like. Hereinafter, processing in step 2 is called entire program-writing processing.

In step 3, the operator disconnects ECU 100 from writing tool 200.

After that, ECU 100 is assembled in each vehicle. Furthermore, in the inspection process, it is checked whether a proper application program is written into ROM 110 of ECU 100 (e.g., whether it is an application program for the vehicle in which ECU 100 is assembled). If the proper application program is not written, writing tool 200 is reconnected to ECU 100 assembled in the vehicle to write a proper application program.

Figure 5:
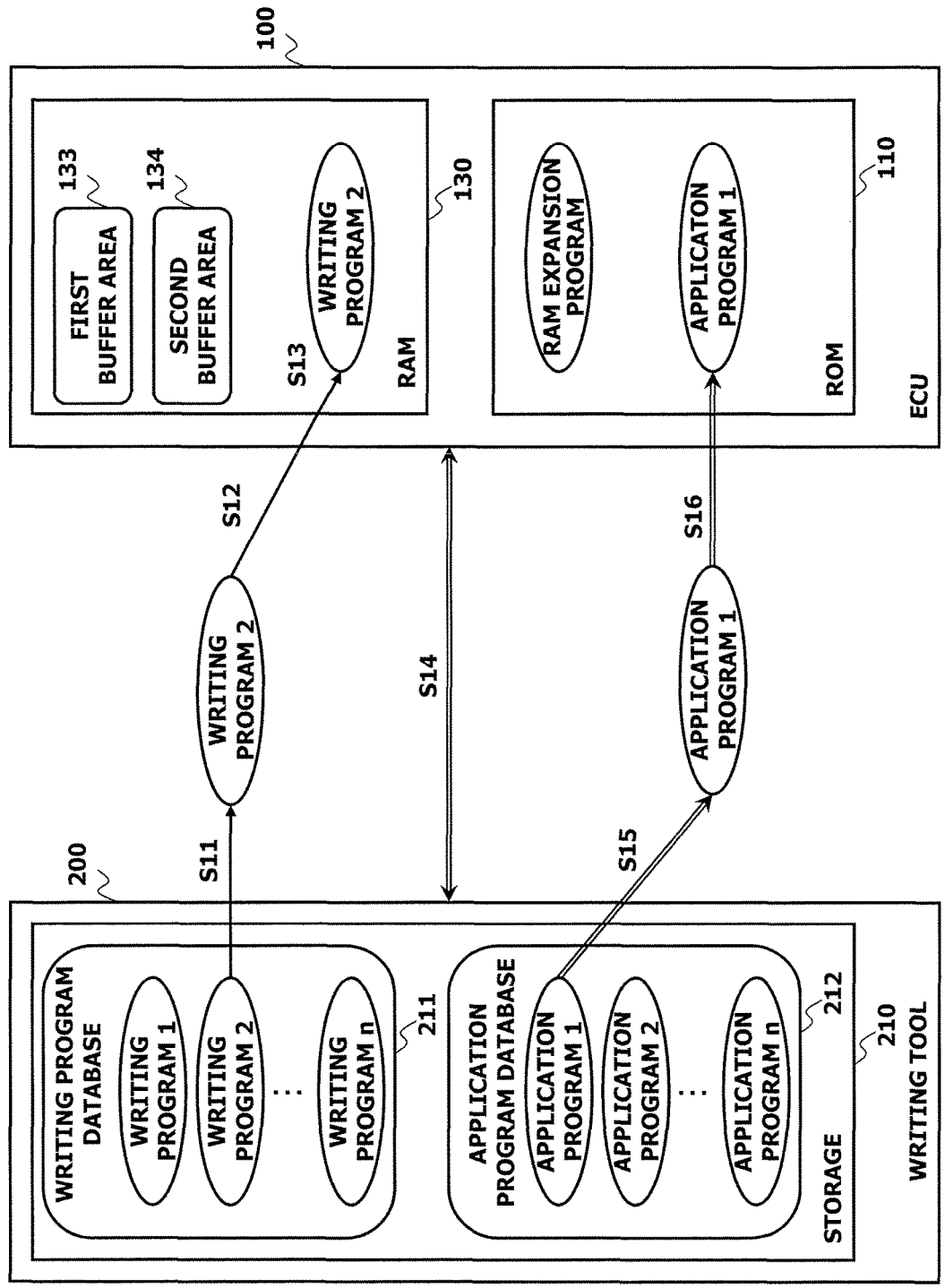
FIG. 5 is a schematic view of overall program-writing processing.

FIG. 5 illustrates the outline of the entire program-writing processing.

In step 11, when the operator specifies a writing program and an application program to be written into ROM 110, writing tool 200 activates a data transfer program for transferring the writing program and the application program. Then, writing tool 200 sends ECU 100 a message indicative of the start of transfer of the writing program (e.g., writing program 2) by means of the data transfer program to transfer the specified writing program.

Here, the writing program specified by the operator is stored in a writing program database 211 existing in storage 210. The writing program is transferred to ECU 100 to perform, on ECU 100, initialization processing such as to change a communication environment, write data receiving processing, and processing for writing write data into ROM 110. The writing program is composed of a writing main program and a writing subprogram.

The writing main program runs on ECU 100 after being transferred to ECU 100, to establish a communication environment (method of using communication buffers, communication speed, encryption scheme, and the like) according to the writing program between writing tool 200 and ECU 100. Furthermore, the writing main program writes the application program transferred from writing tool 200 into ROM 110 according to writing conditions (address of a write area in the ROM, and the like) of the writing program. The writing subprogram is activated from the writing main program to copy received data in communication buffer area 141 to a first buffer area and a second buffer area.

Furthermore, the application program specified by the operator is stored in an application program database 212 existing in storage 210. Each application program is an engine control program or the like according to each type of vehicle.

In step 12, when ECU 100 receives the message indicative of the start of transfer of the writing program from writing tool 200 as the source of the writing program, a RAM expansion program stored in ROM 110 is activated. Here, the RAM expansion program performs processing for expanding, in RAM 130, the writing program received by ECU 100. Thus, ECU 100 expands the received writing program in RAM 130 by means of the RAM expansion program while receiving the writing program.

In step 13, when ECU 100 completes the expansion of the writing program, the writing program expanded in RAM 130 is activated by the RAM expansion program.

In step 14, ECU 100 has the writing program change the communication environment between ECU 100 and writing tool 200 to a communication environment according to the writing program, and sends writing tool 200 a message requesting transmission of an application program.

In step 15, when writing tool 200 receives the message requesting the transmission of an application program, transfer of an application program (e.g., application program 1) specified by the operator to ECU 100 is started by means of the data transfer program.

In step 16, ECU 100 writes the received application program into ROM 110 based on the writing conditions by means of the writing main program and the writing subprogram while receiving the application program from writing tool 200.

After completion of writing, ECU 100 is disconnected from writing tool 200, and hence the power is turned off. When the power of ECU 100 is turned on next, the communication environment of ECU 100 is restored to an initial state (the same communication environment as in step 1). In a case in which some kind of malfunction (e.g., communication with writing tool 200 is cut off or the like while the writing program is running) has occurred during the entire program-writing processing, ECU 100 resets itself. Then, the communication environment of ECU 100 is restored to the initial state.

Thus, a writing program is selected, so that the writing program appropriate for the communication environment used, the writing conditions for the application program, and the like can run in the entire program-writing processing. Therefore, for example, a writing program with higher communication speed can run to perform high-speed communication so as to speed up the entire program-writing processing.

Furthermore, in the entire program-writing processing, the writing program is transferred to ECU 100, and this eliminates the need to store the writing program in ROM 110, enabling reduction in usage of ROM 110.

Furthermore, the writing program can be changed to add a new function in the entire program-writing processing.

In such a situation that any other unit is connected to ECU 100 in addition to writing tool 200, if ECU 100 blocks the communication with the other unit to communicate only with writing tool 200, the entire program-writing processing can be performed.

As an example of performing the entire program-writing processing in such a situation that the other unit is connected to ECU 100 in addition to writing tool 200, there is a case in which an application program is written in such a state that ECU 100 is assembled in a vehicle.

In this case, a communication environment used when ECU 100 communicates with writing tool 200 needs to be a communication environment common to the other unit (e.g., the communication speed is common) in order to prevent competition between communication channels. Therefore, the operator specifies a writing program to establish a communication environment common to the other unit to perform the entire program-writing processing. At this time, ECU 100 communicates only with writing tool 200, blocking communication with the other unit.

Next, a method of using communication buffer area 141 used when ECU 100 receives an application program transferred from writing tool 200 will be described.

In application program writing process 20, since ECU 100 does not communicate with any unit other than writing tool 200, a communication buffer preassigned to the unit other than writing tool 200 (communication buffer for the other unit) is not used.

Thus, the writing program can change the communication buffer for the other unit to be used for communication between ECU 100 and writing tool 200 in addition to the communication buffer for writing tool.

Figure 6:
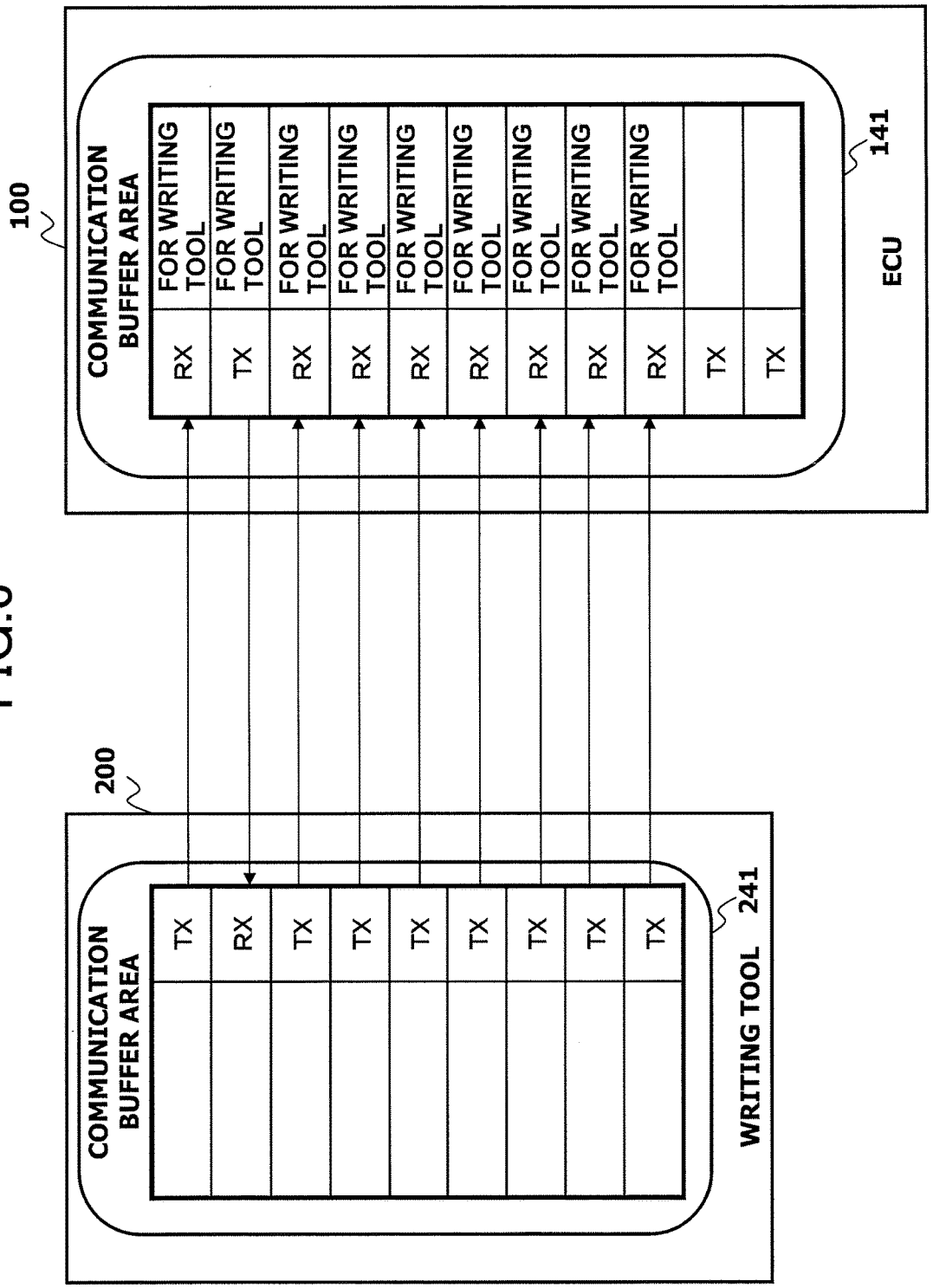
FIG. 6 is a detailed view of the communication buffer areas after a communication environment is changed.

FIG. 6 illustrates the details of communication buffer area 141 after being changed.

In the example of FIG. 6, when communicating with writing tool 200, ECU 100 uses two communication buffers for writing tool and seven communication buffers in communication buffers for other units. At this time, one TX and eight RXs are set as the nine communication buffers used by ECU 100. At this time, communication buffers in communication buffer area 241 of writing tool 200 are eight TXs and one RX.

For example, in a case in which the size of one communication buffer is eight bytes and ECU 100 communicates with writing tool 200 in synchronization with each other to return a response to writing tool 200 each time one piece of data is received, since eight RXs can be used to receive one piece of data, ECU 100 just has to perform communication nine times to receive 64 bytes of data from writing tool 200. In other words, writing tool 200 transfers 64 bytes of data by dividing it into eight bytes of data as one piece of data, and ECU 100 returns a response to writing tool 200 each time eight pieces of eight-byte data are received. Thus, the number of communications is nine.

The writing program may set the number of communication buffers used for ECU 100 to communicate with writing tool 200 to a number according to the size of data to be sent and received, an integral multiple of the size of data to be sent and received, the size of one write into ROM 110, an integral multiple of the size of one write into ROM 110, or the like.

Thus, since communication can be performed by using communication buffers for other units in addition to communication buffers for writing tool, the number of communications in the case of communication requiring synchronization can be reduced, reducing the time required to transfer data and hence speeding up the transfer of data. Furthermore, since communication buffers for other units are used, writing tool 200 can continuously transfer data without taking into account overwriting of communication buffers.

In communication buffer area 141, if there is any unused communication buffer that is not assigned to any unit, the writing program can use the unused communication buffer for communication between ECU 100 and writing tool 200. Since this increases the size of communication buffer capable of being used for receiving one piece of data, the number of communications can be further reduced.

Next, each program running in the entire program-writing processing will be described.

Figure 7:
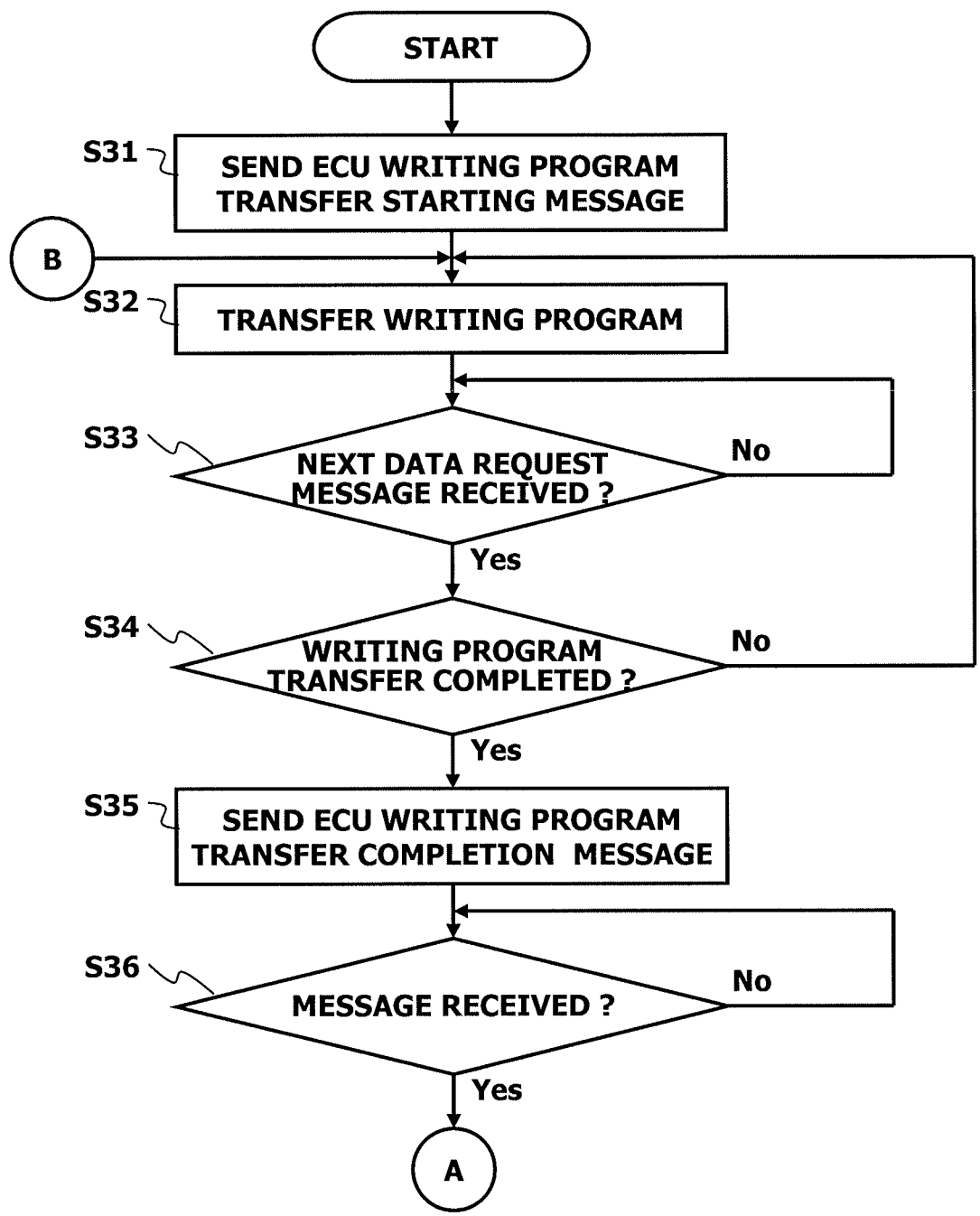
FIG. 7 is a flowchart of processing performed by a data transfer program of the writing tool.
Figure 8:
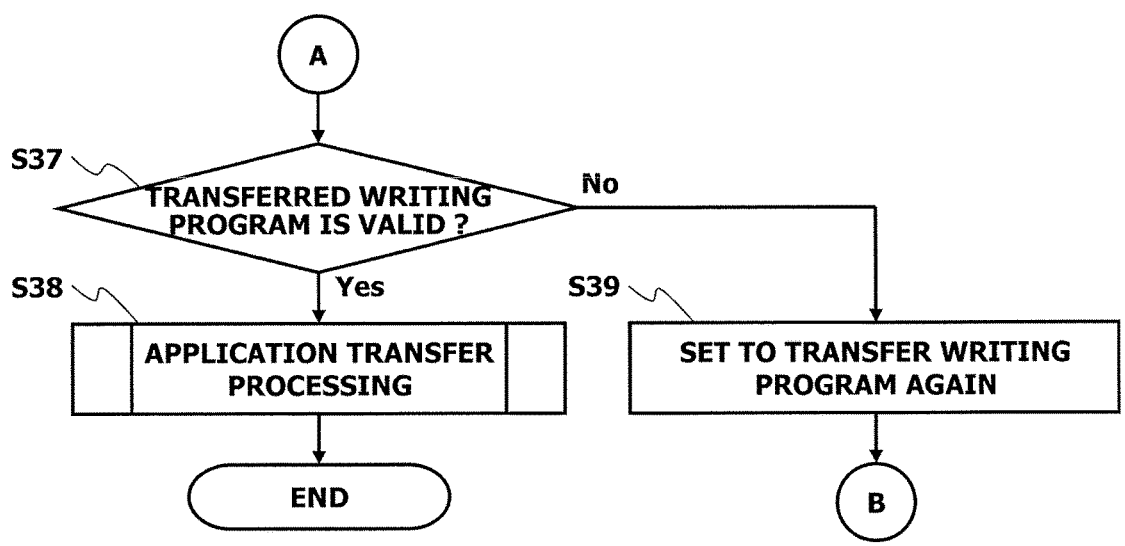
FIG. 8 is a flowchart of processing performed by the data transfer program of the writing tool.

FIG. 7 and FIG. 8 illustrate flowcharts of processing performed by the data transfer program on writing tool 200 when the writing program and the application program are specified by the operator on writing tool 200.

In step 31, the data transfer program sends ECU 100 a message (writing program transfer starting message) indicative of the start of transfer of the writing program.

In step 32, the data transfer program sequentially transfers data of the specified writing program by an amount of data size that ECU 100 can receive in one communication.

In step 33, the data transfer program determines whether a next data request message was received from ECU 100. When the next data request message is received from ECU 100, the data transfer program proceeds the processing to step 34 (Yes), whereas when the next data request message is not received from ECU 100, the processing is returned to step 33 (No).

In step 34, the data transfer program determines whether the transfer of the specified writing program is completed. When the transfer of the specified writing program is completed, the data transfer program proceeds the processing to step 35 (Yes), whereas when the transfer of the specified writing program is not completed, the processing is returned to step 32 (No).

In step 35, the data transfer program sends ECU 100 a message indicative of completion of the transfer of the writing program (transfer of writing program completion message).

In step 36, the data transfer program determines whether a message is received from ECU 100. When a message is received from ECU 100, the data transfer program proceeds the processing to step 37 (Yes), whereas when no message is received from ECU 100, it returns the processing to step 36 (No).

In step 37, the data transfer program determines whether the message received from ECU 100 is a message indicating that the writing program is transferred correctly. When the received message is the message indicating that the writing program is transferred correctly, the data transfer program proceeds the processing to step 38 (Yes), whereas when the received message is not the message indicating that the writing program is transferred correctly, the data transfer program proceeds the processing to step 39 (No).

In step 38, the data transfer program executes an application transfer processing subroutine. The application transfer processing subroutine is to perform processing for dividing and transferring data of the specified application program. Hereinafter, the data divided and transferred is called divided data.

In step 39, the data transfer program is set to transfer the writing program again from the beginning (e.g., return the index of the writing program to the beginning or the like).

Figure 9:
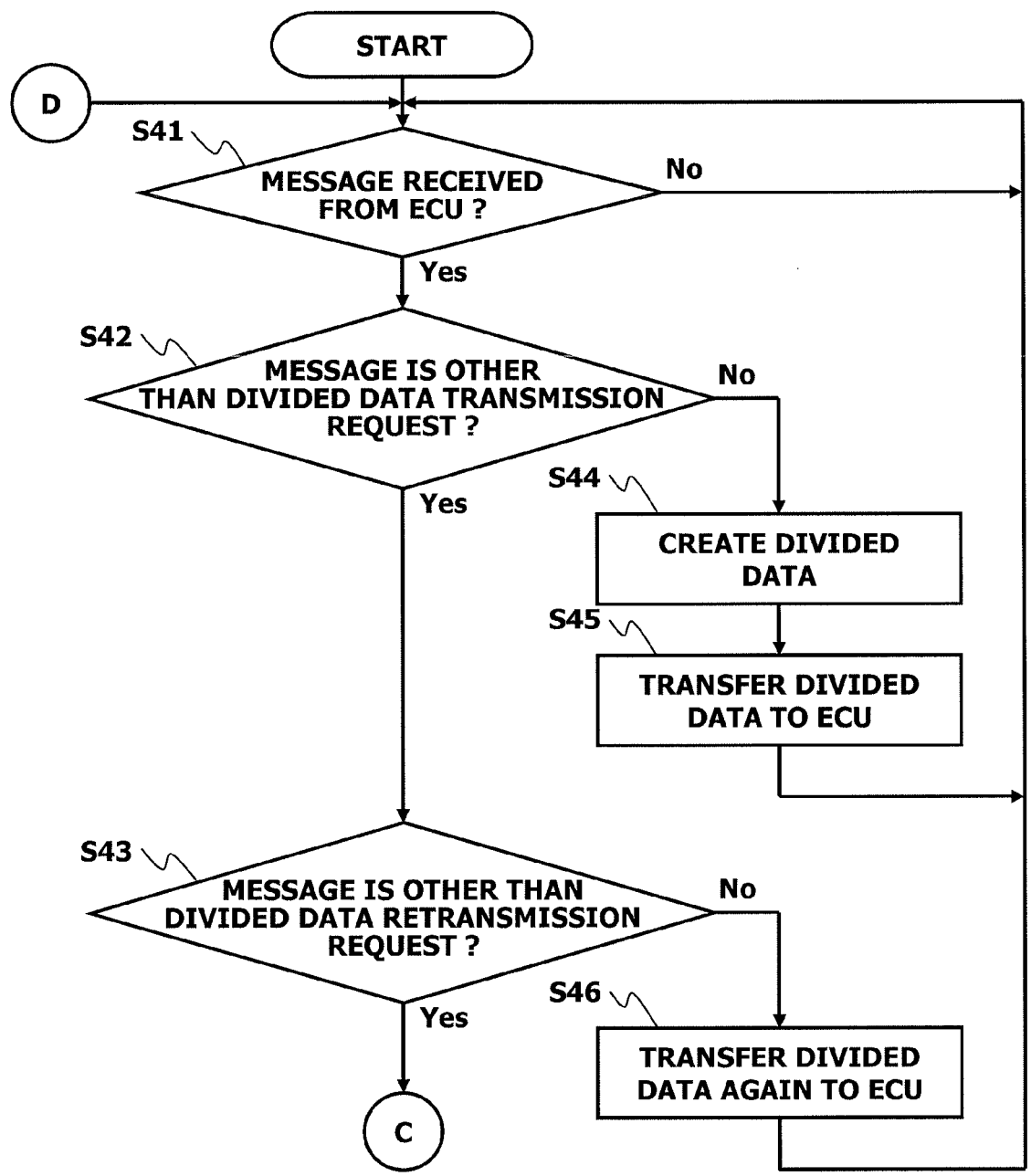
FIG. 9 is a flowchart of processing performed by the data transfer program of the writing tool.
Figure 10:
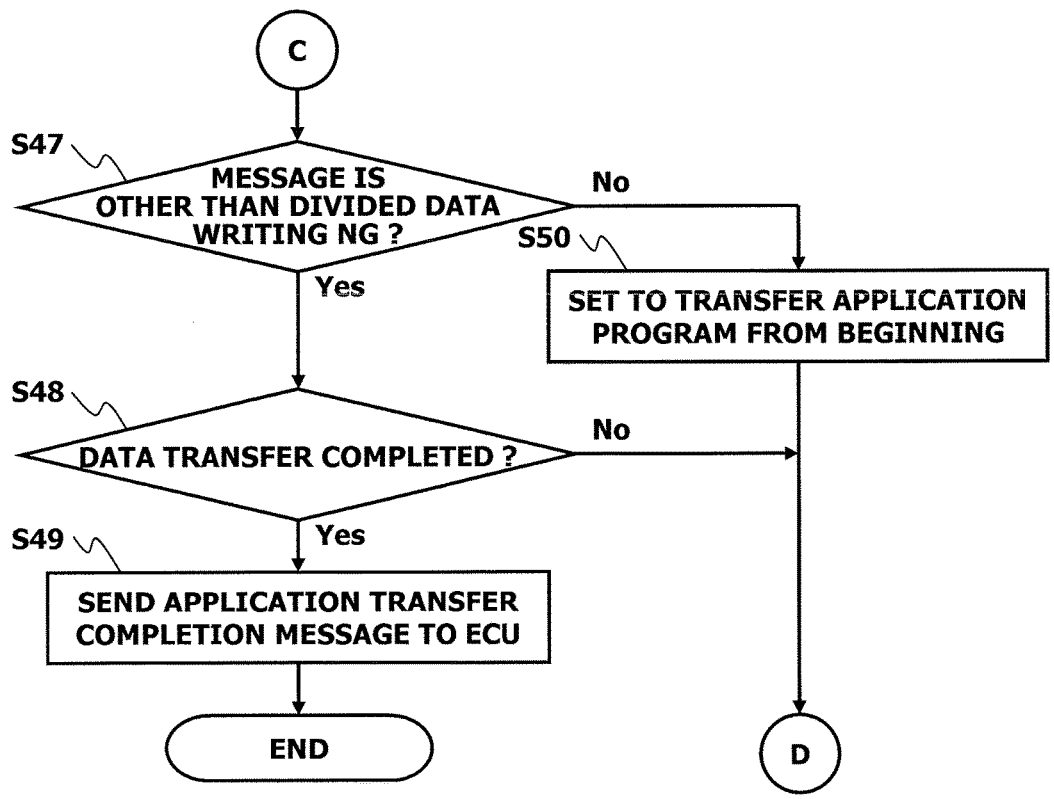
FIG. 10 is a flowchart of processing performed by the data transfer program of the writing tool.

FIG. 9 and FIG. 10 illustrate flowcharts of the application transfer processing subroutine.

In step 41, the data transfer program determines whether writing tool 200 received a message from ECU 100. When a message is received from ECU 100, the data transfer program proceeds the processing to step 42 (Yes), whereas when no message is received from ECU 100, the data transfer program returns the processing to step 41 (No).

In step 42, the data transfer program determines whether the received message is any message other than a message indicative of a transmission request for divided data (divided data transmission request message). When the received message is a message other than the divided data transmission request message, the data transfer program proceeds the processing to step 43 (Yes), whereas when the received message is the divided data transmission request message, the data transfer program proceeds the processing to step 44 (No).

In step 43, the data transfer program determines whether the received message is any message other than the message indicative of the retransmission request for divided data (divided data retransmission request message). When the received message is a message other than the divided data retransmission request message, the data transfer program proceeds the processing to step 47 (Yes), whereas when the received message is the divided data retransmission request message, the data transfer program proceeds the processing to step 46 (No).

In step 44, the data transfer program reads data from a position, to which a read pointer representing the index of the specified application program points, and creates divided data with a checksum added to the read data. Here, the size of reading data is set to a value obtained by subtracting the size of the checksum from the total size of RXs used in the communication environment established by the transferred writing program on ECU 100.

The initial value of the read pointer is the start address of the application program. Each time step 44 is executed, the read pointer is incremented by the size of reading data.

For example, in a case in which the total size of RXs used in the communication environment established by the transferred writing program is 64 bytes and the size of the checksum is two bytes, the size of reading data is 62 bytes and the size of divided data is 64 bytes.

For data verification, there is an error-detecting code such as CRC (Cyclic Redundancy Check) in addition to the checksum. Furthermore, it may be checked whether divided data is received in the right order in such a manner that at the side of writing tool 200, divided data includes a sequence number indicating how many pieces of divided data preceded before the divided data is transferred, and at the side of ECU 100 checks on the sequence number of the received divided data.

In step 45, the data transfer program transfers the created divided data to ECU 100. At this time, the data transfer program classifies the divided data by the size of TX in communication buffer area 241 and stores each piece in each TX in communication buffer area 241 to transfer the divided data. For example, in a case in which the divided data is 64 bytes and there are eight TXs, each of which is eight bytes, in communication buffer area 241, the data transfer program classifies the divided data into eight pieces of eight-byte data and stores each piece in each TX.

The data stored in the TX is transferred to ECU 100 by means of communication circuit 240.

In step 46, the data transfer program transfers the created divided data again to ECU 100.

In step 47, the data transfer program determines whether the received message is any message other than a message indicating that the divided data is not written correctly into ROM 110 of ECU 100 (divided data writing NG message). When the received message is any message other than the divided data writing NG message, the data transfer program proceeds the processing to step 48 (Yes), whereas when the received message is the divided data writing NG message, the data transfer program proceeds the processing to step 50 (No).

In step 48, the data transfer program determines whether the transfer of the application program is completed to the end based on whether the read pointer reaches the end of the application program. When the transfer of the application program is completed to the end, the data transfer program proceeds the processing to step 49 (Yes), whereas when the transfer of the application program is not completed to the end, the data transfer program returns the processing to step 41 (No).

In step 49, the data transfer program sends ECU 100 a message indicative of completion of the transfer of the application program (application transfer completion message).

In step 50, the data transfer program sets the value of the read pointer to a start address of the application program to transfer the application program again from the beginning. After that, the data transfer program returns the processing to step 41.

Figure 11:
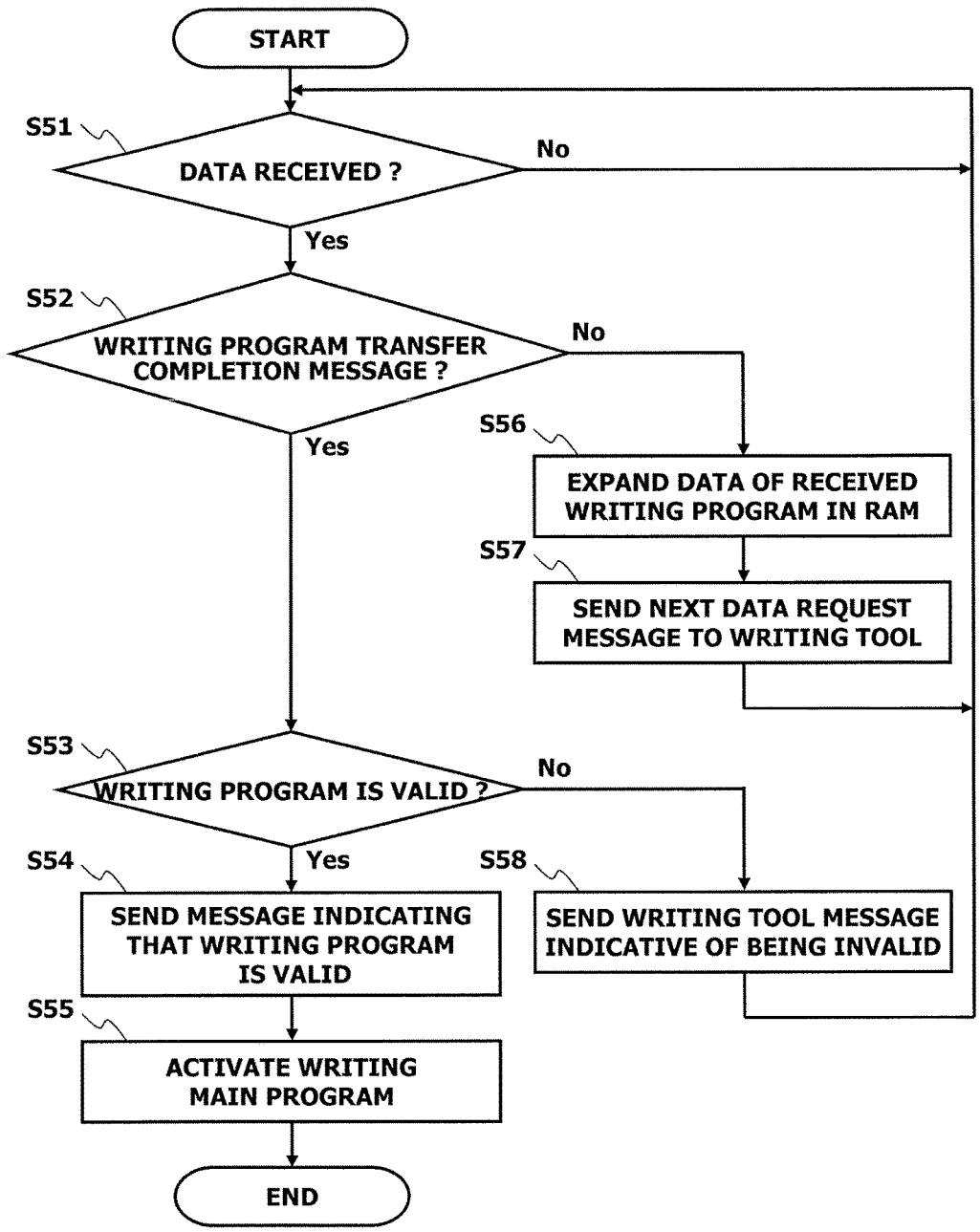
FIG. 11 is a flowchart of processing performed by a RAM expansion program of the ECU.

FIG. 11 illustrates a flowchart of processing performed by the RAM expansion program on ECU 100 when ECU 100 received the writing program transfer starting message.

In step 51, the RAM expansion program determines whether ECU 100 received data from writing tool 200. When ECU 100 receives data from writing tool 200, the RAM expansion program proceeds the processing to step 52 (Yes), whereas when it do not received data from writing tool 200, the RAM expansion program returns the processing to step 51 (No).

In step 52, the RAM expansion program determines whether the received data is a message of writing program transfer completion. When the received data is the message of writing program transfer completion, the RAM expansion program proceeds the processing to step 53 (Yes), whereas when the received data is not the message of writing program transfer completion, the RAM expansion program proceeds the processing to step 56 (No).

In step 53, the RAM expansion program determines whether the transferred writing program is valid by using the checksum or the like. When the transferred writing program is valid, the RAM expansion program proceeds the processing to step 54 (Yes), whereas when the transferred writing program is not valid, the RAM expansion program proceeds the processing to step 58 (No).

In step 54, the RAM expansion program sends writing tool 200 a message indicating that the writing program is transferred correctly.

In step 55, the RAM expansion program activates the writing main program in the writing program expanded in RAM 130.

In step 56, the RAM expansion program expands, in RAM 130, the received data of the writing program from RX in communication buffer area 141.

In step 57, the RAM expansion program sends writing tool 200 a next data request message. After that, the RAM expansion program returns the processing to step 51.

In step 58, the RAM expansion program sends writing tool 200 a message indicating that the writing program is not transferred correctly. After that, the RAM expansion program returns the processing to step 51.

Figure 12:
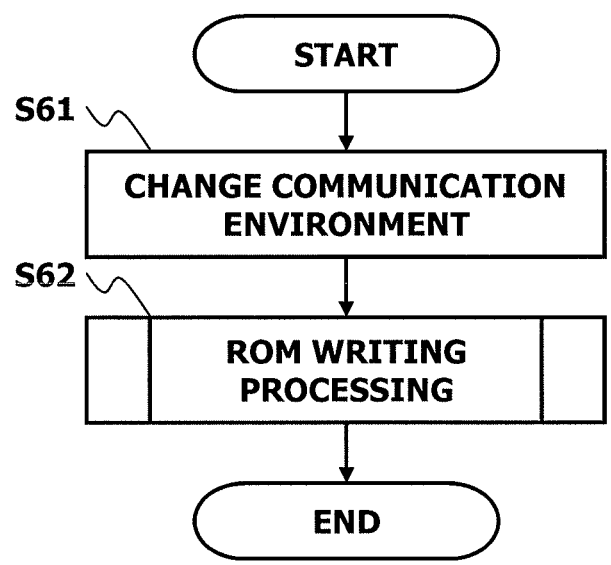
FIG. 12 is a flowchart of processing performed by a writing main program of the ECU.

FIG. 12 illustrates a flowchart of processing performed by the writing main program on ECU 100 when the writing main program is activated.

In step 61, according to the transferred writing program, the writing main program changes the communication environment in which ECU 100 communicates with writing tool 200. When ECU 100 is communicable with any unit other than writing tool 200, the communication environment may not be changed.

In step 62, the writing main program executes a ROM writing processing subroutine. The ROM writing processing subroutine is to receive divided data from writing tool 200 as the source of the divided data and write data of the application program into ROM 110 based on the divided data.

Figure 13:
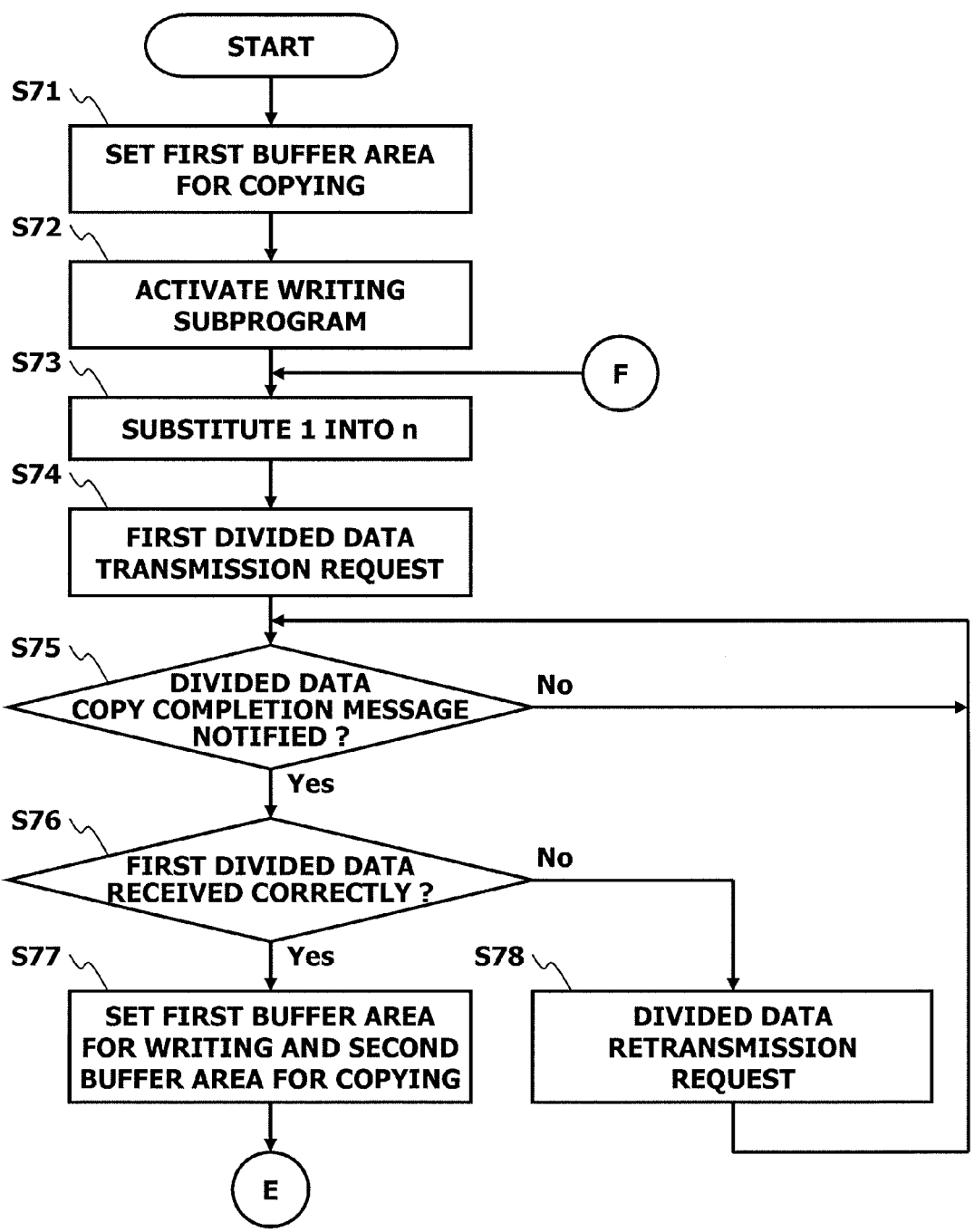
FIG. 13 is a flowchart of processing performed by the writing main program of the ECU.
Figure 14:
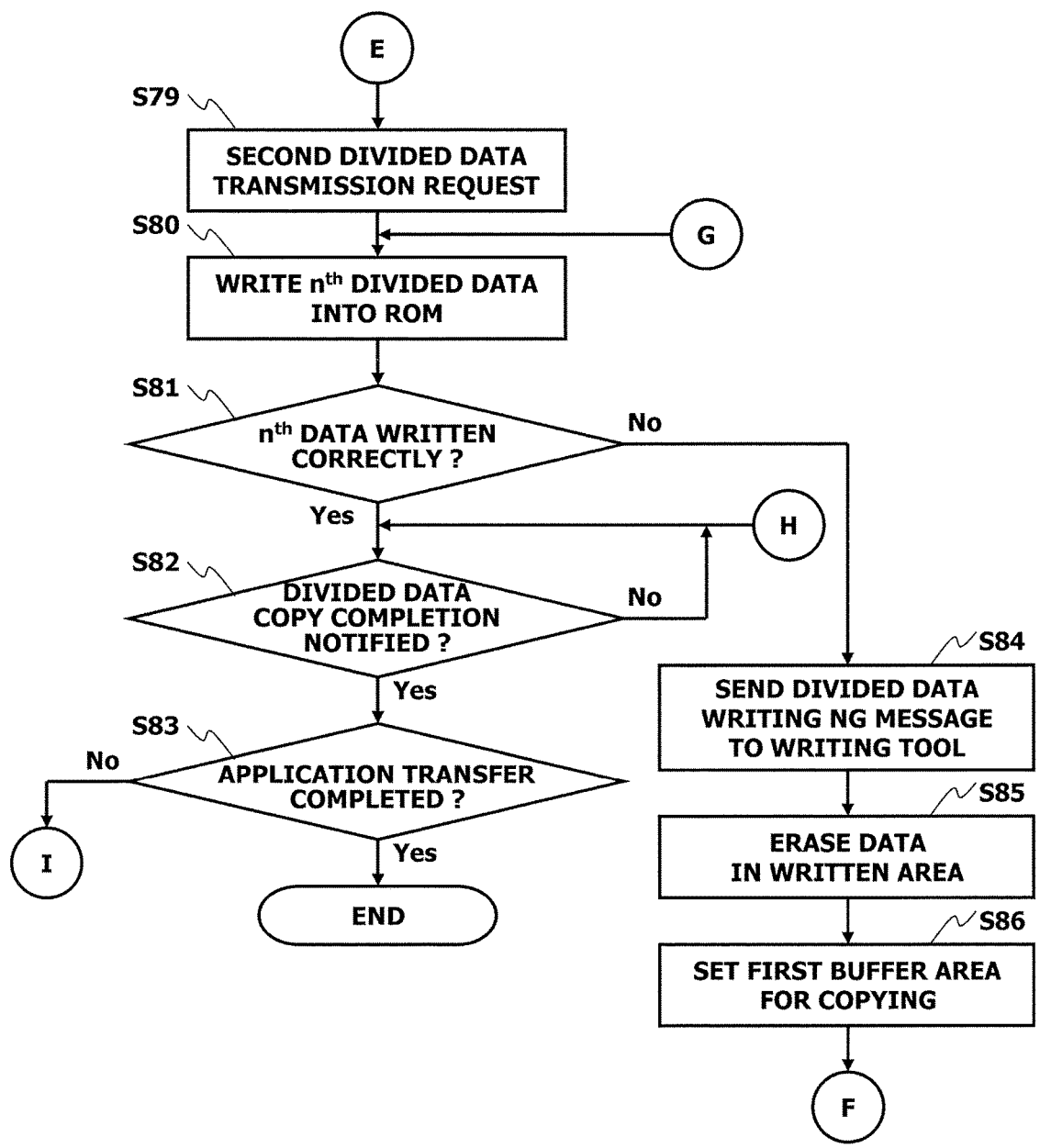
FIG. 14 is a flowchart of processing performed by the writing main program of the ECU.
Figure 15:
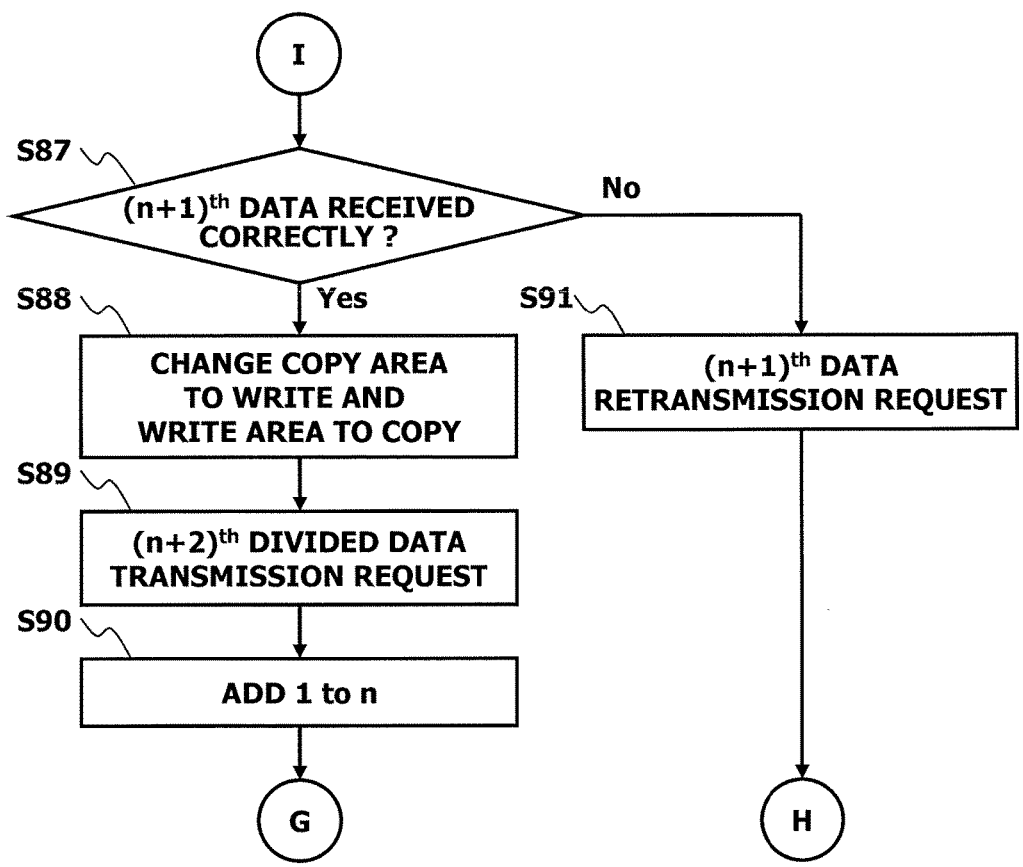
FIG. 15 is a flowchart of processing performed by the writing main program of the ECU.

FIG. 13 to FIG. 15 illustrate the ROM writing processing subroutine.

In step 71, the writing main program sets first buffer area 133 in a copy area for copying divided data received from writing tool 200.

In step 72, the writing main program activates a writing subprogram.

In step 73, the writing main program substitutes 1 into a variable n as a counter representing how many pieces of data preceded before a piece of data being processed in the data (data of the application program) to be written into ROM 110.

In step 74, the writing main program sends writing tool 200 a divided data transmission request message to receive first divided data.

In step 75, the writing main program determines whether a message (divided data copy completion message) indicating that divided data received from writing tool 200 is copied to the copy area is notified from the writing subprogram. When the divided data copy completion message is notified, the writing main program proceeds the processing to step 76 (Yes), whereas when the divided data copy completion message is not notified, the writing main program returns the processing to step 75 (No).

In step 76, the writing main program refers to the first divided data stored in the copy area to use the checksum included in the divided data so as to determine whether the first divided data is able to be received correctly. When the first divided data is able to be received correctly, the writing main program proceeds the processing to step 77 (Yes), whereas when the first divided data is not able to be received correctly, the writing main program proceeds the processing to step 78 (No).

In step 77, the writing main program sets first buffer area 133 in a write area used when divided data is written into ROM 110 and sets second buffer area 134 in the copy area.

In step 78, the writing main program sends writing tool 200 a divided data retransmission request message to re-receive the first divided data. After that, the writing main program returns the processing to step 75. A message (divided data receiving NG message) indicating that the divided data is not able to be received correctly may also be sent to writing tool 200 together with the divided data retransmission request message.

In step 79, the writing main program sends writing tool 200 a divided data transmission request message to receive second divided data. A message (divided data receiving OK message) indicating that the previous divided data is able to be received correctly may also be sent to writing tool 200 together with the divided data transmission request message.

In step 80, the writing main program removes the checksum from $n^{th}$ divided data stored in the write area and writes, into ROM 110, the data stored in the write area according to the writing conditions.

In step 81, the writing main program verifies the write data to determine whether the $n^{th}$ data is written into ROM 110 correctly. When the $n^{th}$ data is written into ROM 110 correctly, the writing main program proceeds the processing to step 82 (Yes), whereas when the $n^{th}$ data is not written into ROM 110 correctly, the writing main program proceeds the processing to step 84 (No).

The write data is verified by comparing, for example, the content of the write area with the content of a written area of ROM 110.

In step 82, the writing main program determines whether the divided data copy completion message was notified from the writing subprogram. When the divided data copy completion message is notified, the writing main program proceeds the processing to step 83 (Yes), whereas when the divided data copy completion message is not notified, the writing main program returns the processing to step 82 (No).

In step 83, the writing main program determines whether the data stored in the copy area is the application transfer completion message. When the data stored in the copy area is the application transfer completion message, the writing main program terminates the processing (Yes), whereas when the data stored in the copy area is not the application transfer completion message, the writing main program proceeds the processing to step 87 (No).

In step 84, the writing main program sends writing tool 200 a divided data writing NG message.

In step 85, the writing main program erases data in the written area of ROM 110.

In step 86, the writing main program sets the copy area to first buffer area 133.

In step 87, the writing main program verifies, based on the checksum, $(n+1)^{th}$ divided data copied in the copy area to determine whether the $(n+1)^{th}$ divided data is able to be received correctly. When the $(n+1)^{th}$ divided data is able to be received correctly, the writing main program proceeds the processing to step 88 (Yes), whereas when the $(n+1)^{th}$ divided data is not able to be received correctly, the writing main program proceeds the processing to step 91 (No). The $(n+1)^{th}$ divided data may also be verified by the writing subprogram immediately after the $(n+1)^{th}$ divided data is received.

In step 88, the writing main program changes, to the write area, the buffer area set for copying, and changes, to the copy area, the buffer area set for writing.

In step 89, the writing main program sends writing tool 200 a divided data transmission request message to receive $(n+2)^{th}$ divided data.

Together with the divided data transmission request message, a message (divided data writing OK message) indicating that the $n^{th}$ divided data is written into ROM 110 and a message (divided data receiving OK message) indicating that the $(n+1)^{th}$ divided data is received may be sent to writing tool 200.

In step 90, after adding 1 to n, the writing main program returns the processing to step 80.

In step 91, the writing main program sends writing tool 200 a divided data retransmission request message to re-receive the $(n+1)^{th}$ divided data. After that, the writing main program returns the processing to step 82. Together with the divided data retransmission request message, a message (divided data receiving NG message) indicating that the $(n+1)^{th}$ divided data is not able to be received correctly may be sent to writing tool 200.

Figure 16:
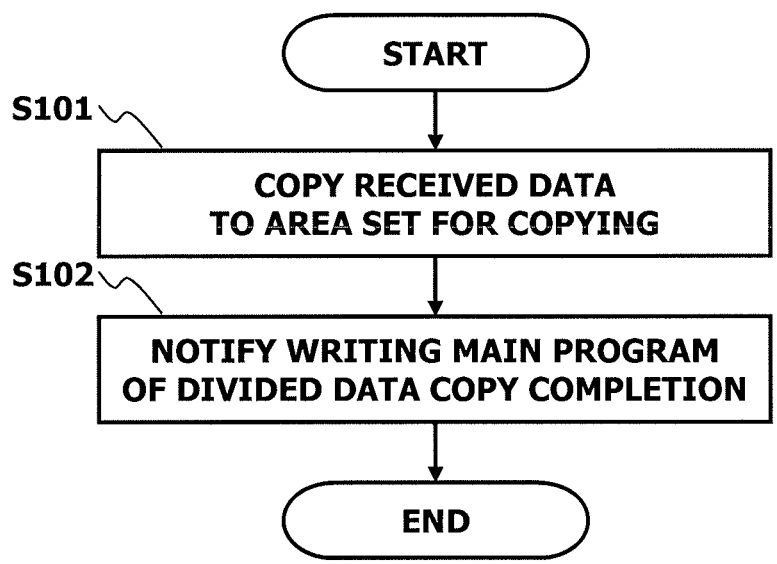
FIG. 16 is a flowchart of processing performed by a writing subprogram of the ECU.

FIG. 16 illustrates a flowchart of processing performed by the writing subprogram on ECU 100 when ECU 100 received data from writing tool 200.

In step 101, the writing subprogram copies, to the copy area, divided data received from RX of communication buffer area 141.

In step 102, the writing subprogram notifies the writing main program of a divided data copy completion message.

The copy area may be set in an area corresponding to RX of communication buffer area 141 to receive data using the copy area in ECU 100. In this case, there is no need to copy, to the copy area, divided data from RX of communication buffer area 141.

Furthermore, in a case in which there is a difference between processing time from the divided data transmission request to completion of copying and the time required for writing of data into ROM 110 and verification, processing for receiving next divided data and processing for writing data into ROM 110 may be started upon completion of either one of the processings that takes a longer time.

Thus, two buffer areas are prepared for writing received divided data into ROM 110 in parallel with receiving divided data through RX. Then, the two buffer areas are so used that when one buffer area is used for processing to write into ROM 110, the other buffer area is used for processing for ECU 100 to copy the received divided data. Here, the buffer area used for write processing and the buffer area used for copy processing are switched therebetween each time the respective processing is performed. This enables ECU 100 to perform, in parallel, processing for writing data into ROM 110 using one buffer area and processing for receiving divided data and copying received divided data to the other buffer area. Therefore, the time required for the entire program-writing processing is able to be shortened.

Furthermore, since processing on ECU 100 side has only to be changed to perform these processing, the time required for the entire program-writing processing is able to be shortened without changing writing tool 200 substantially.

A sequence of an example of the application program transfer and writing processing will be as illustrated in FIG. 17. Here, the size of the program transferred by writing tool 200 is 180 bytes. Further, the total size of respective RXs of ECU 100 is 64 bytes.

ECU 100 sends writing tool 200 a first divided data transmission request message.

Among pieces of data of the application program, writing tool 200 reads first 62 bytes of data, generates first divided data with two bytes of checksum added thereto, and transfers the first divided data to ECU 100.

After receiving the first divided data, ECU 100 copies the first divided data from RX of communication buffer area 141 to first buffer area 133. Next, ECU 100 verifies the first divided data and sends writing tool 200 a second divided data transmission request message. Furthermore, ECU 100 uses first buffer area 133 to perform processing for writing data into ROM 110 and verification of write data.

When receiving the second divided data transmission request message, writing tool 200 reads 62 bytes of data to be transferred next, generates second divided data with the checksum added thereto, and transfers the second divided data to ECU 100.

After receiving the second divided data, ECU 100 copies the second divided data from RX of communication buffer area 141 to second buffer area 134. Next, ECU 100 verifies the second divided data. After completion of verification of the second divided data and verification of the first write data, ECU 100 sends writing tool 200 a third divided data transmission request message. Furthermore, ECU 100 uses second buffer area 134 to perform processing for writing data into ROM 110 and verification for the write.

After receiving the third divided data transmission request message, writing tool 200 reads the remaining 56 bytes of data, generates third divided data with the checksum added thereto, and transfers the third divided data to ECU 100.

Processing after ECU 100 receives the third divided data is the same as the processing after receiving the second divided data.

When receiving a fourth divided data transmission request message, writing tool 200 sends ECU 100 an application transfer completion message.

The embodiment may also be applied to various electronic control units each equipped with a nonvolatile memory. Two or more ECUs 100 may be connected to one writing tool 200 so that one writing tool 200 transfers, to each ECU 100, data to be written into ROM 110 in a time-shared manner.

Furthermore, verification of the received divided data and verification of the written data in the nonvolatile memory may be performed further in parallel. This can shorten the time required to write the entire program into the nonvolatile memory, compared with processing to which data verification is added to processing for writing the entire program.

The entire contents of Japanese Patent Application No. 2011-205440, filed Sep. 21, 2011, are incorporated herein by reference.

While only a select embodiment has been chosen to illustrate the present invention, it will be apparent to those skilled in the art from this disclosure that various changes and modifications can be made herein without departing from the scope of the invention as defined in the appended claims.

Furthermore, the foregoing description of the embodiments according to the present invention is provided for illustration only, and not for the purpose of limiting the invention, the invention as claimed in the appended claims and their equivalents.

What is claimed is:

1. An electronic control unit for a vehicle including a nonvolatile memory in which data can be written and erased electronically and two buffers, in which the electronic control unit for a vehicle is able to receive, by communication, divided data obtained by dividing a vehicle type-specific application program by predetermined size, comprising a processor which, in parallel with receiving the divided data by using the two buffers alternately, writes the divided data into the nonvolatile memory by using the two buffers alternately, such that one of the two buffers is used for receiving the divided data while the other of the two buffers is used for writing the divided data and the receiving and the writing of the divided data alternate between the two buffers each time the receiving and the writing are performed,
wherein the receiving and the writing of the divided data by the processor is controlled by a writing program received from a writing tool through communication between the electronic control unit and the writing tool,
wherein the received writing program is expanded in a volatile memory, based on an expansion program stored in the nonvolatile memory, prior to activating the writing program by the expansion program,
wherein the writing program changes a communication environment between the electronic control unit and the writing tool, in addition to the writing of the divided data, and
wherein the electronic control unit and the writing tool are removably connected through a communication line, and the electronic control unit and the writing tool communicate in synchronization with each other.

2. The electronic control unit for a vehicle, according to claim 1, wherein the processor starts receiving next divided data and writing the divided data, in response to completion of receiving the divided data.

3. The electronic control unit for a vehicle, according to claim 1, wherein the processor returns a response to a source of the divided data to indicate that the divided data is received and the divided data is written into the nonvolatile memory, upon completion of receiving the divided data and writing the divided data.

4. The electronic control unit for a vehicle, according to claim 1, wherein the processor further performs verification of the divided data in the two buffers and verification of the divided data in the nonvolatile memory in parallel.

5. The electronic control unit for a vehicle, according to claim 4, wherein the verification of the divided data in the two buffers is performed by using an error-detecting code included in the divided data.

6. The electronic control unit for a vehicle, according to claim 4, wherein the verification of the divided data in the nonvolatile memory is performed by comparing the data in the nonvolatile memory with the data in the two buffers.

7. The electronic control unit for a vehicle, according to claim 1, wherein the electronic control unit includes a communication circuit, and the processor is programmed to assign communication buffers of the communication circuit, which communicate with units other than the writing tool, to communication with the writing tool when receiving the application program.

8. A method of writing data by an electronic control unit for a vehicle including a nonvolatile memory in which data can be written and erased electronically and two buffers, the method comprising the steps of:
in parallel with receiving divided data obtained by dividing a program by predetermined size, by using the two buffers alternately, writing the divided data into the nonvolatile memory by using the two buffers alternately, such that one of the two buffers is used for receiving the divided data while the other of the two buffers is used for writing the divided data and the receiving and the writing of the divided data alternate between the two buffers each time the receiving and the writing are performed,
wherein the receiving and the writing of the divided data is controlled by a writing program received from a writing tool through communication between the electronic control unit and the writing tool,
wherein the received writing program is expanded in a volatile memory, based on an expansion program stored in the nonvolatile memory, prior to activating the writing program by the expansion program,
wherein the writing program changes a communication environment between the electronic control unit and the writing tool, in addition to the writing of the divided data, and
wherein the electronic control unit and the writing tool communicate in synchronization with each other through a removably connected communication line.

9. The method of writing data according to claim 8, wherein the electronic control unit for a vehicle starts receiving next divided data and writing the divided data, in response to completion of receiving the divided data.

10. The method of writing data according to claim 8, wherein the electronic control unit for a vehicle returns a response to a source of the divided data to indicate that the divided data is received and written into the nonvolatile memory, upon completion of receiving the divided data and writing the divided data.

11. The method of writing data according to claim 8, wherein the electronic control unit for a vehicle further performs verification of the divided data in the two buffers and verification of the divided data in the nonvolatile memory in parallel.

12. The method of writing data according to claim 11, wherein the verification of the divided data in the two buffers is performed by using an error-detecting code included in the divided data.

13. The method of writing data according to claim 11, wherein the verification of the divided data in the nonvolatile memory is performed by comparing the data in the nonvolatile memory with the data in the two buffers.

14. The method of writing data according to claim 8, wherein the electronic control unit includes a communication circuit, and the processor is programmed to assign communication buffers of the communication circuit, which communicate with units other than the writing tool, to communication with the writing tool when receiving the application program.

* * * * *